US011545937B2

(12) United States Patent
Khlat et al.

(10) Patent No.: US 11,545,937 B2
(45) Date of Patent: Jan. 3, 2023

(54) DUAL-MODE AVERAGE POWER TRACKING (APT) CONTROLLER

(71) Applicant: Qorvo US, Inc., Greensboro, NC (US)

(72) Inventors: Nadim Khlat, Cugnaux (FR); Jean-Frederic Chiron, Tournefeuille (FR); Robert Moehrke, Winston Salem, NC (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 17/215,132

(22) Filed: Mar. 29, 2021

(65) Prior Publication Data
US 2022/0311387 A1 Sep. 29, 2022

(51) Int. Cl.
*H03F 1/02* (2006.01)
*H03F 3/21* (2006.01)

(52) U.S. Cl.
CPC ............ *H03F 1/0233* (2013.01); *H03F 3/21* (2013.01); *H03F 2200/105* (2013.01); *H03F 2200/165* (2013.01)

(58) Field of Classification Search
CPC .... H03F 1/0233; H03F 3/21; H03F 2200/105; H03F 2200/165
USPC .......................... 330/136, 127, 129, 206, 297
See application file for complete search history.

(56) References Cited

U.S. PATENT DOCUMENTS

| 10,622,898 B1 | 4/2020 | Henzler et al. |
| 2013/0214858 A1* | 8/2013 | Tournatory ............. H02M 1/14 330/127 |
| 2016/0094192 A1 | 3/2016 | Khesbak et al. |

OTHER PUBLICATIONS

Taranovich, S. et al., "Enhancing the inefficiency of an RF power amp: The envelope tracking system," EDN, Oct. 9, 2013, Retrieved from the Internet: <URL: https://www.edn.com/enhancing-the-inefficiency-of-an-rf-power-amp-the-envelope-tracking-et-system/>, [retrieved on Aug. 23, 2022], 18 pages.
Extended European Search Report for European Patent Application No. 22157582.2, dated Sep. 5, 2022, 8 pages.

* cited by examiner

*Primary Examiner* — Samuel S Outten
*Assistant Examiner* — Khiem D Nguyen
(74) *Attorney, Agent, or Firm* — Withrow & Terranova, P.L.L.C.

(57) ABSTRACT

A dual-mode average power tracking (APT) controller operates in a first mode to move the control voltage quickly without concern for ripple or ringing. When this coarse adjustment takes the control voltage to within a desired margin of a target, the controller may switch to a second mode, where the APT controller more slowly approaches the target, but has reduced ringing or ripples. The mode is changed by changing resistance and capacitance values in a loop filter within the APT circuit. In a further aspect, a pulse shaper circuit may inject a pulse to force the control voltage to change more rapidly. By switching modes in this fashion, the control voltage may quickly reach a desired target, and then remain in the second mode during a transmission time slot such that the control voltage is clean throughout.

20 Claims, 7 Drawing Sheets

DUAL-MODE AVERAGE POWER TRACKING (APT) CONTROLLER

FIELD OF THE DISCLOSURE

The technology of the disclosure relates generally to average power tracking (APT) in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). In part because of the frequencies at which it operates, 5G-NR implements a rigorous power control scheme with frequent changes to transmission power levels. The frequent changes in transmission power levels in turn necessitate the ability to change the output of power amplifier arrays quickly, which is typically done through some form of envelope tracking (ET) or average power tracking (APT). Even with ET and APT approaches, frequent power level changes necessitate frequently changing control signals sent to the power amplifier arrays.

Conventional approaches to fast changes in control signals generated by ET and APT circuits involve changing the size of capacitors and inductors in the control circuit, and specifically, reducing the size of capacitors and inductors in the control circuit, which generally makes the control signal change faster. However, reducing the size of the capacitors and inductors may introduce other unwanted ripples in the control signal. Accordingly, improved control techniques are warranted.

SUMMARY

Aspects disclosed in the detailed description include a dual-mode average power tracking (APT) controller. In a first mode, the APT controller operates to move the control voltage quickly without concern for ripple or ringing. When this coarse adjustment takes the control voltage to within a desired margin of a target, the controller may switch to a second mode, where the APT controller more slowly approaches the target, but has reduced ringing or ripples. The mode is changed by changing resistance and capacitance values in a loop filter within the APT circuit. In a further aspect, a pulse shaper circuit may inject a pulse to force the control voltage to change more rapidly. By switching modes in this fashion, the control voltage may quickly reach a desired target, and then remain in the second mode during a transmission time slot such that the control voltage is clean throughout.

In one aspect, an APT circuit is disclosed. The APT circuit comprises a digital-to-analog converter (DAC) comprising. The DAC comprises a change signal output and a target control voltage signal output. The APT circuit also comprises a transition management circuit coupled to the change signal output and comprising a mode output configured to provide a mode signal. The APT circuit also comprises a loop filter coupled to the target control voltage signal output and the mode output. A change in the mode signal causes the loop filter to switch between a first mode and a second mode and the loop filter is configured to provide a signal. The APT circuit also comprises output circuitry configured to provide a voltage control signal based on the signal from the loop filter.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
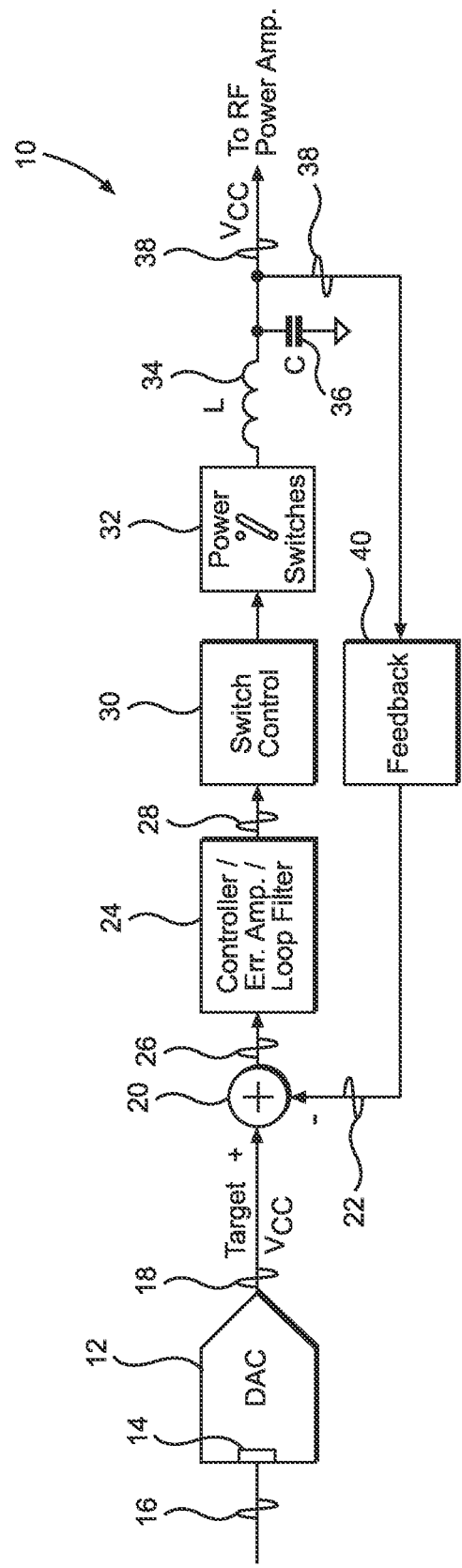
FIG. 1 is a block diagram of a conventional average power tracking (APT) circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a dual-mode average power tracking (APT) controller. In a first mode, the APT controller operates to move the control voltage quickly without concern for ripple or ringing. When this coarse adjustment takes the control voltage to within a desired margin of a target, the controller may switch to a second mode, where the APT controller more slowly approaches the target, but has reduced ringing or ripples. The mode is changed by changing resistance and capacitance values in a loop filter within the APT circuit. In a further aspect, a pulse shaper circuit may inject a pulse to force the control voltage to change more rapidly. By switching modes in this fashion, the control voltage may quickly reach a desired target, and then remain in the second mode during a transmission time slot such that the control voltage is clean throughout.

In this regard, FIG. 1 illustrates a block diagram of a conventional APT circuit 10. The APT circuit 10 includes a digital-to-analog converter (DAC) 12. The DAC 12 includes an input 14 (input 14 may be a pin or a node as is well understood) that receives a digital signal 16 from an envelope tracking (ET) circuit (not shown), The DAC 12 converts the digital signal 16 to an analog target control voltage signal 18. An adder 20 adds the target control voltage signal 18 to an inverted (negative) feedback signal 22. The adder 20 is coupled to a loop filter 24. The loop filter 24 may also include a controller (not shown) and/or an error amplifier (also not shown). A signal 26 from the adder 20 is filtered by the loop filter 24 to produce a signal 28. The signal 28 is provided to a switch control circuit 30, which turns on and off switches in a switch array circuit 32 based on the signal 28. The switch control circuit 30 represents a function that sequences the closing of the various power switches in the switch array circuit 32 to control the output of the switch array circuit 32. In an exemplary aspect, the switch control circuit 30 may be a pulse width modulation (PWM) modulator. The output of the switch array circuit 32 is filtered by an inductor 34 and a capacitor 36 to provide a voltage control signal 38 (also referred to as Vcc), which is used to control power amplifiers in a transmitter (not shown). The voltage control signal 38 is also provided to a feedback circuit 40, which provides the feedback signal 22 to the adder 20.

New cellular standards like 5G changed the RF output power control scheme such that power changes are frequent, especially compared to previous cellular standards. For example, 5G-NR may have a power change occurring within 8.3 microseconds (µs) with a 120 kilohertz (kHz) sub-carrier spacing (SCS). Consequently, the power amplifier voltage must settle extremely fast when there is a power level change. For APT, where Vcc is only supposed to change when power is requested to change, such fast transitions are a challenge while having stable Vcc during unchanging slots.

Figure 2A:
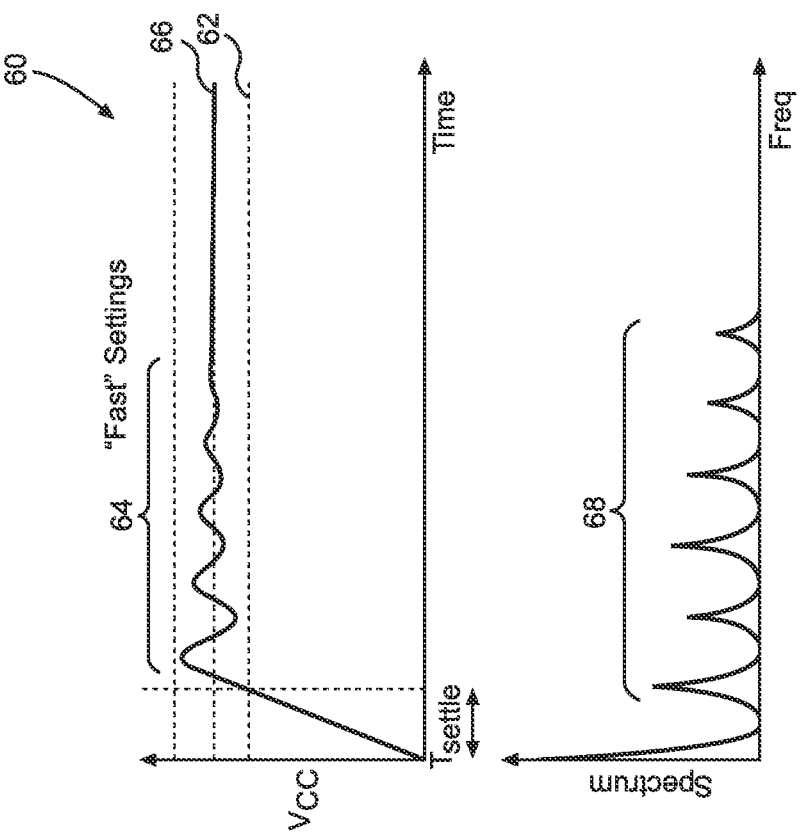
FIG. 2A shows a control signal and frequency response for a traditional APT circuit.

In conventional systems, for a given load, and assuming an "ideal" control of the switches in the switch array circuit 32, the limit on how fast Vcc can change is the capacitance of the capacitor 36 along with a rate of charging for the capacitor (i.e., how quickly can current be "poured into" the capacitor 36), The charging rate is a function of the inductor 34, with the rate increasing as the inductance of the inductor 34 decreases. Further, the more voltage across the inductor 34, the faster the current change rate. Using traditional systems may result in a slow settle as seen in FIG. 2A where graph 50 shows Vcc requiring time Tsettle to get to a lower threshold 52 and even more time to get to the final target level 54. The slow approach to the final target level 54 results in relatively low ringing in the frequency domain as evidenced by spurs 56.

Figure 2B:
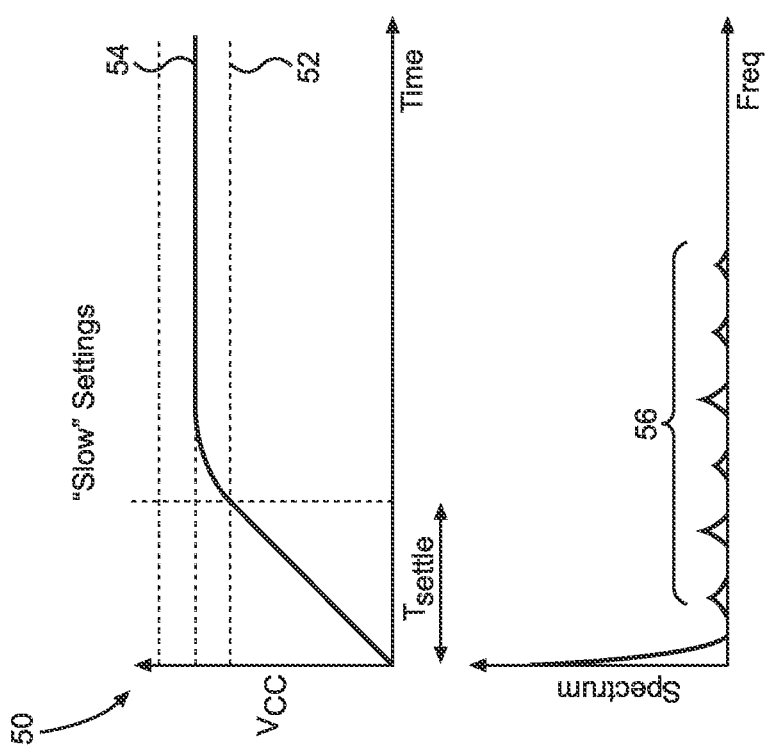
FIG. 2B shows a control signal and frequency response for an accelerated traditional APT circuit.

While one approach to get fast APT transitions is to decrease the inductance and capacitance of the inductor 34 and the capacitor 36, reductions in these values increase the ripple or ringing at harmonics. Using this approach results in graph 60 shown in FIG. 2B, where Vcc reaches a lower threshold 62, relatively quickly as shown by the small Tsettle, but has ripple 64 before settling at the final target level 66, Likewise, there is substantial ringing as shown by spurs 68. The presence of this ripple requires the switching frequency to be increased to limit the ripple. The net result of this approach negatively impacts noise performance and efficiency, such that this solution is not commercially practical for 5G-NR.

Exemplary aspects of the present disclosure adopt a two-mode approach, where a first fast mode, but likely ringing- or ripple-inducing, circuit is used to make a coarse adjustment that quickly changes Vcc to a value within a predefined threshold of a target Vcc value, and a second slow mode is used to provide a clean non-ringing, but comparatively slow, fine adjustment to Vcc that changes Vcc to the final target Vcc value and holds Vcc at this final target cleanly for the desired duration (e.g., in the "slot"). To switch between modes, the loop filter circuit is changed. In a specifically contemplated aspect, the resistance(s) and/or capacitance(s) within the loop filter are changed. In a further aspect, a pulse shaper circuit may be used to inject a hard pulse form to assist in changing the input to the switch control circuit to the desired target value.

Figure 3:
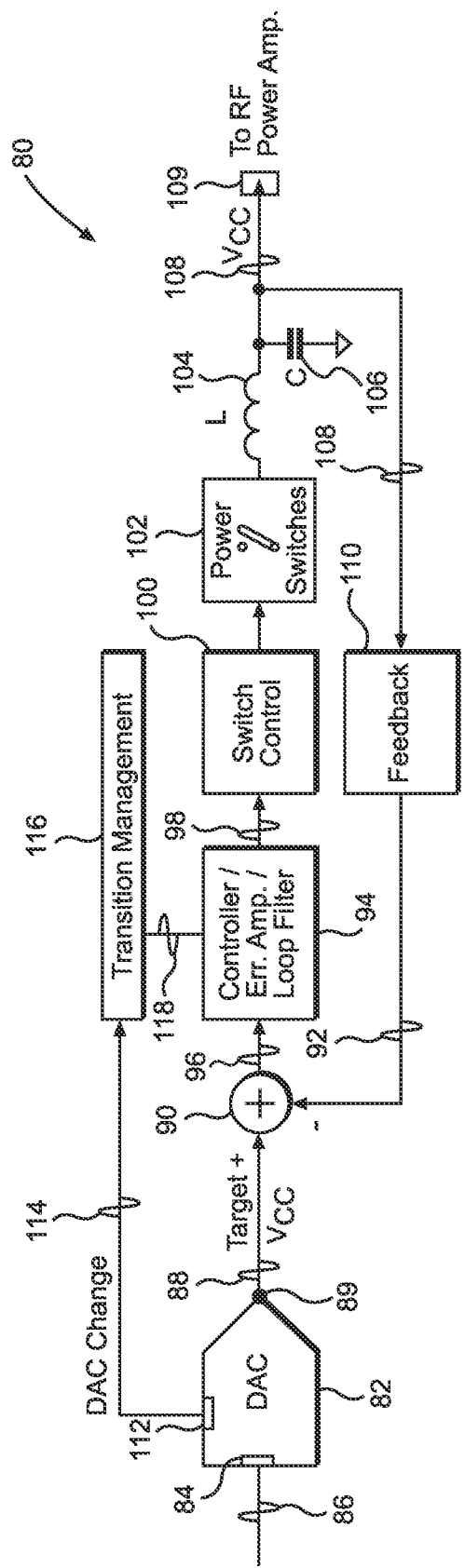
FIG. 3 is a block diagram of a dual-mode APT circuit according to an exemplary aspect of the present disclosure.

In this regard. FIG. 3 illustrates an APT circuit 80 that includes a DAC 82. The DAC 82 includes an input 84 (which may be a pin or a node as is well understood) that receives a digital signal 86 from an ET circuit (not shown). The DAC 82 converts the digital signal 86 to an analog target control voltage signal 88 at a target control voltage signal output 89 (which may also be a pin or a node). An adder 90 (equivalently an adder circuit) adds the target control voltage signal 88 to an inverted (negative) feedback signal 92. The adder 90 is coupled to a loop filter 94, and thus, the loop filter 94 is coupled to the target control voltage signal output 89 indirectly. The loop filter 94 may also include a controller (not shown) and/or an error amplifier (also not shown). A signal 96 from the adder 90 is filtered by the loop filter 94 to produce a signal 98. The signal 98 is provided to a switch control circuit 100, which turns on and off switches in a switch array circuit 102 based on the signal 98. The switch control circuit 100 represents a function that sequences the closing of the various power switches in the switch array circuit 102 to control the output of the switch array circuit 102. In an exemplary aspect, the switch control circuit 100 may be a PWM modulator. The output of the switch array circuit 102 is filtered by an inductor 104 and a capacitor 106 to provide a voltage control signal 108 (also referred to as Vcc) at an output 109 (which may also be a pin or a node). The voltage control signal 108 is used to control power amplifiers in a transmitter (not shown). The voltage control signal 108 is also provided to a feedback circuit 110, which provides the feedback signal 92 to the adder 90. Collectively, the switch control circuit 100, the switch array circuit 102, and the filter formed by the inductor 104 and the capacitor 106 may be considered output circuitry that is configured to provide the voltage control signal 108 based on the signal 98 at the output 109. The constituent elements of the output circuitry may vary without departing from the scope of the present disclosure.

With continued reference to FIG. 3, the DAC 82 also includes a change signal output 112 (which may also be a pin or node) that provides a signal 114 indicative of a change in state of the DAC 82. In an exemplary aspect, the signal 114 is generated each time there is a change in the state of the DAC 82. Alternatively, the signal 114 may be generated only when the change in state exceeds a predefined threshold. The signal 114 may include information not merely relating to the existence of a change in state, but also a magnitude and direction of the change. The change in state of the DAC 82 is indicative of a needed change in the voltage control signal 108, and thus, small changes needed to the voltage control signal 108 may not need to implement the fast mode of the present disclosure.

Figure 4:
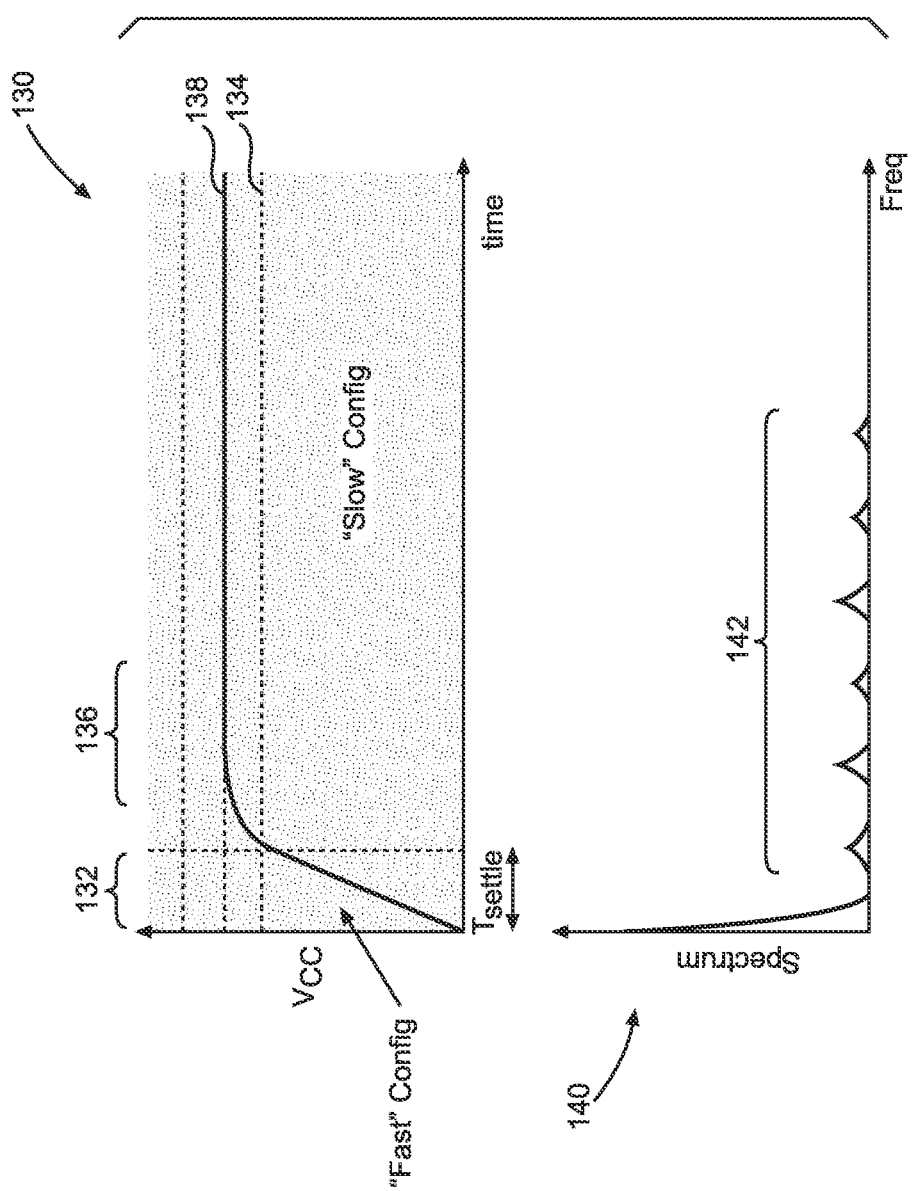
FIG. 4 shows a control signal and frequency response for the APT circuit of FIG. 3.

A transition management circuit 116 is coupled to the change signal output 112 to receive the signal 114. The transition management circuit 116 is configured to provide a mode signal 118 to the loop filter 94. Based on the mode signal 118, the loop filter 94 may change between a first mode (i.e., a fast mode) and a second mode (i.e., a slow mode), FIG. 4 illustrates the difference in modes. Specifically, graph 130 shows Vcc rapidly climbing in the first mode 132 until a threshold 134 is reached, at which time the mode signal 118 causes the loop filter 94 to change the second mode 136 which allows Vcc to settle slowly to the target value 138, effectively without ripple and as evidenced by the spectrum graph 140, with little or no problematic ringing 142.

Figure 5:
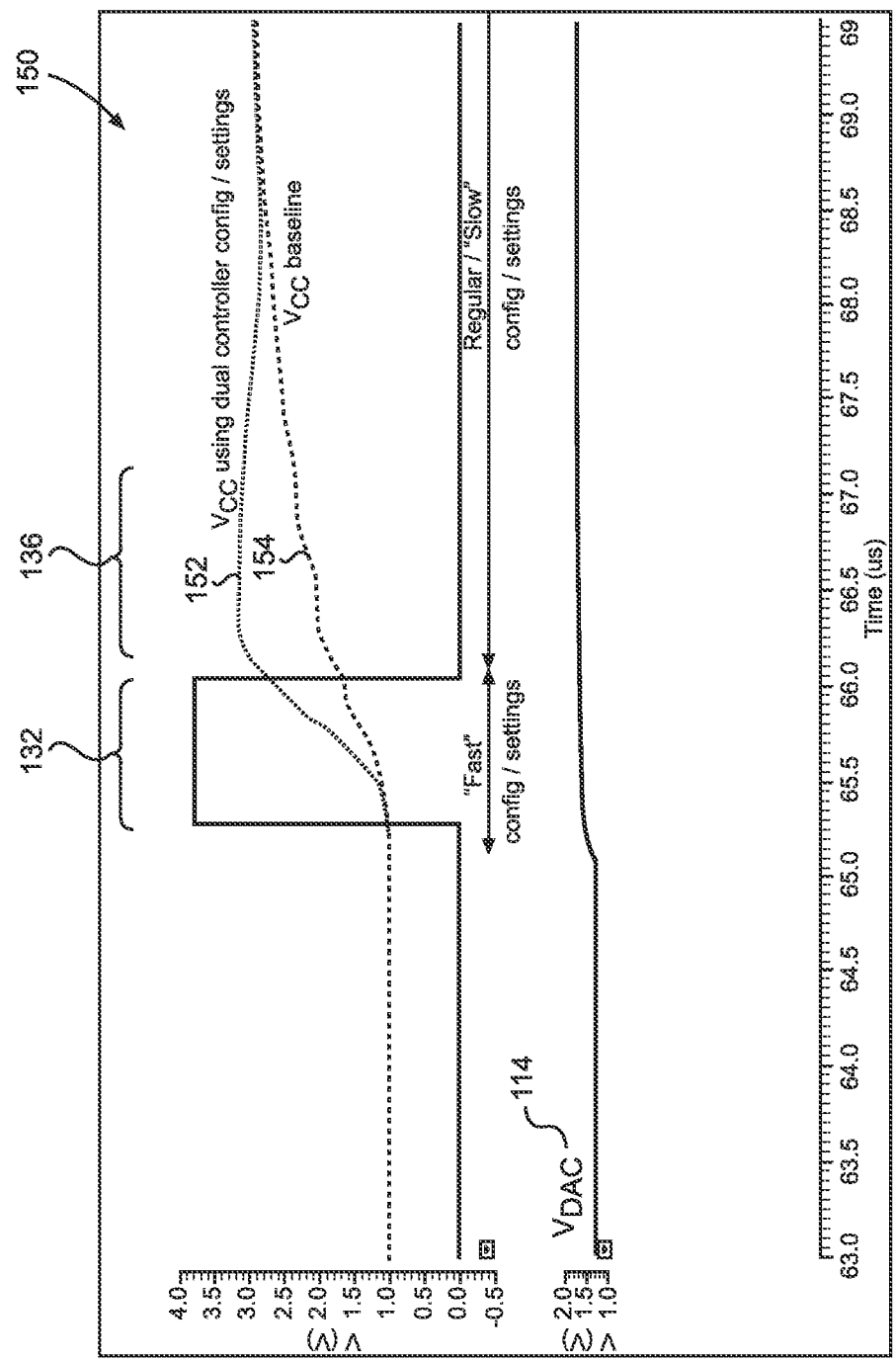
FIG. 5 is a signal versus time graph showing how a control signal of a dual-mode APT circuit compares to a control signal from a traditional APT circuit.

Exemplary test results comparing the dual-mode approach of the present disclosure to conventional systems are shown in graph 150 of FIG. 5, where the first mode 132 lasts from approximately 65.25 µs to 66 µs (or about 0.75 µs) after which the second mode 136 begins. Vcc 152 reaches a zone close to the target Vcc value much faster than the Vcc baseline 154 of the conventional approach. The signal 114 from the DAC 82 is also included to show the transition relative to the change in the DAC 82.

Figure 6:
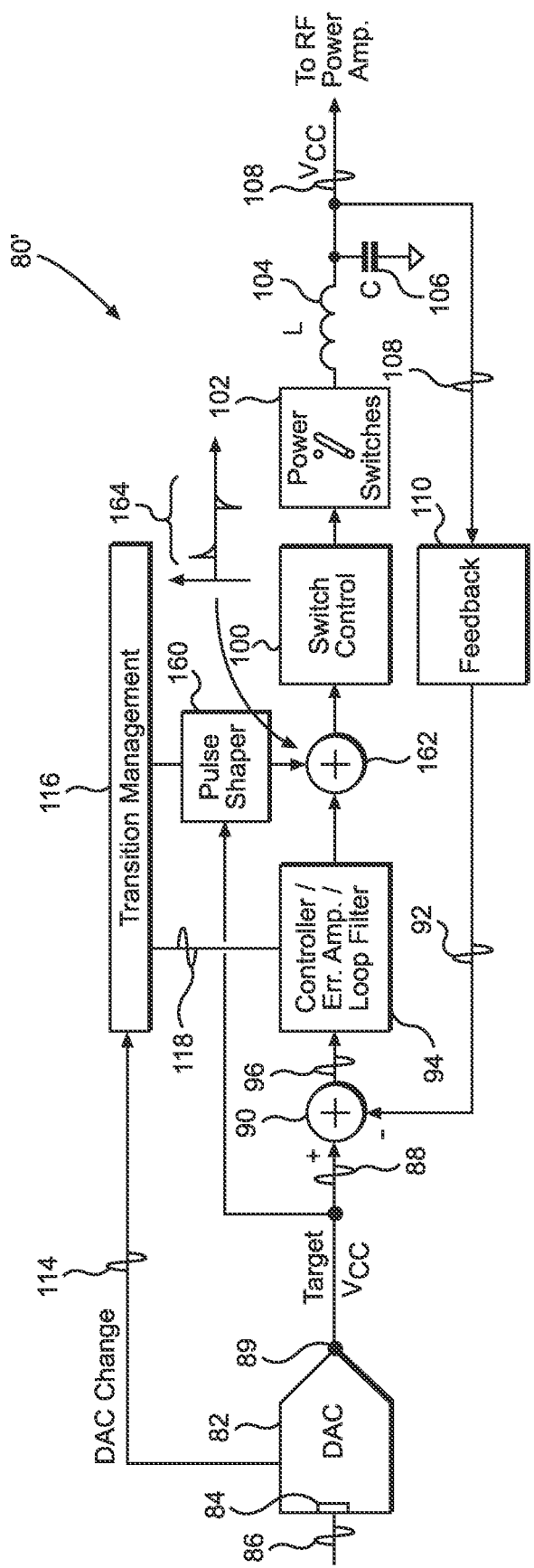
FIG. 6 is a block diagram of a dual-mode APT circuit with a pulse shaper circuit added according to an exemplary aspect of the present disclosure.

FIG. 6 provides an alternate aspect where a pulse shaper circuit 160 is added to the APT circuit 80'. The pulse shaper circuit 160 is coupled to an adder 162 (equivalently an adder circuit or second adder circuit) positioned between the loop filter 94 and the switch control circuit 100. The pulse shaper circuit 160 may inject voltage spurs or other pulse signals 164 (positive or negative) through the adder 162 to facilitate more rapid changes in Vcc.

In an exemplary aspect, the pulse shaper circuit 160 is controlled by the transition management circuit 116 and may have a programmable duration period. That is, the height and/or length of the pulse to be injected may be varied. The programmable duration period may be a function of a battery voltage and/or a voltage step change. For example, if there is a relatively small voltage step change of one volt (1 V), a smaller (magnitude and/or duration) pulse may be applied than if there were a relatively larger step change of three volts (3 V).

Figure 7A:
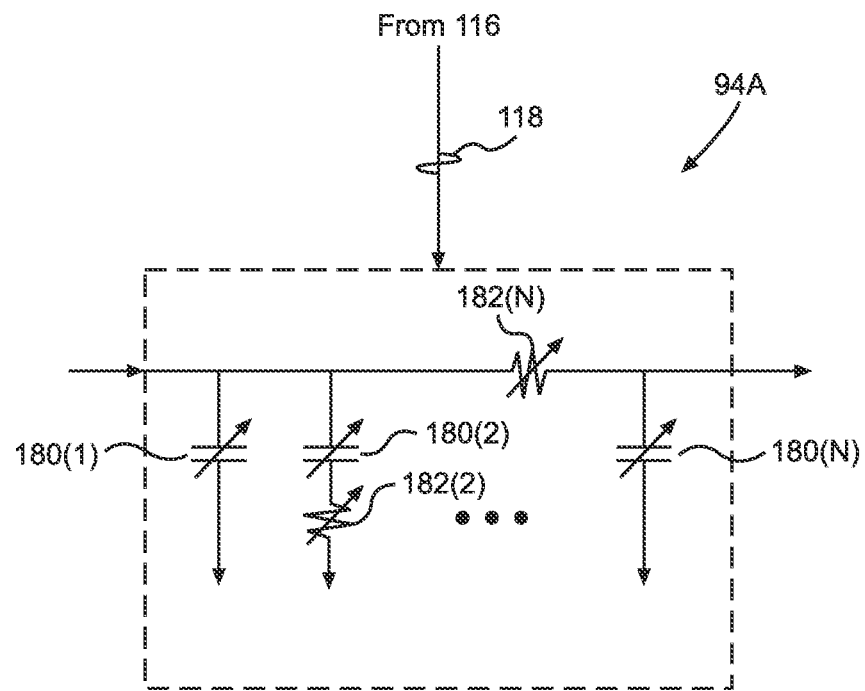
FIG. 7A is a circuit diagram of an exemplary loop filter circuit with variable resistances and capacitances that are modified according to mode according to exemplary aspects of the present disclosure.

While the loop filter 94 may take any number of forms including, for example, type I, II, or III loop filters, most such filters include one or more resistors and one or more capacitors. Exemplary aspects of the present disclosure change these resistances and capacitances to change between the first mode and the second mode. In a first exemplary aspect, variable resistors are used as illustrated in FIG. 7A. In a second exemplary aspect, switches are used to switch between resistors and/or capacitors having different values as illustrated in FIG. 7B.

In this regard, FIG. 7A illustrates a loop filter 94A, with variable capacitors 180(1)-180(N) and variable resistors 182(2)-182(N). The mode signal 118 causes the values of the variable elements to be changed.

Figure 7B:
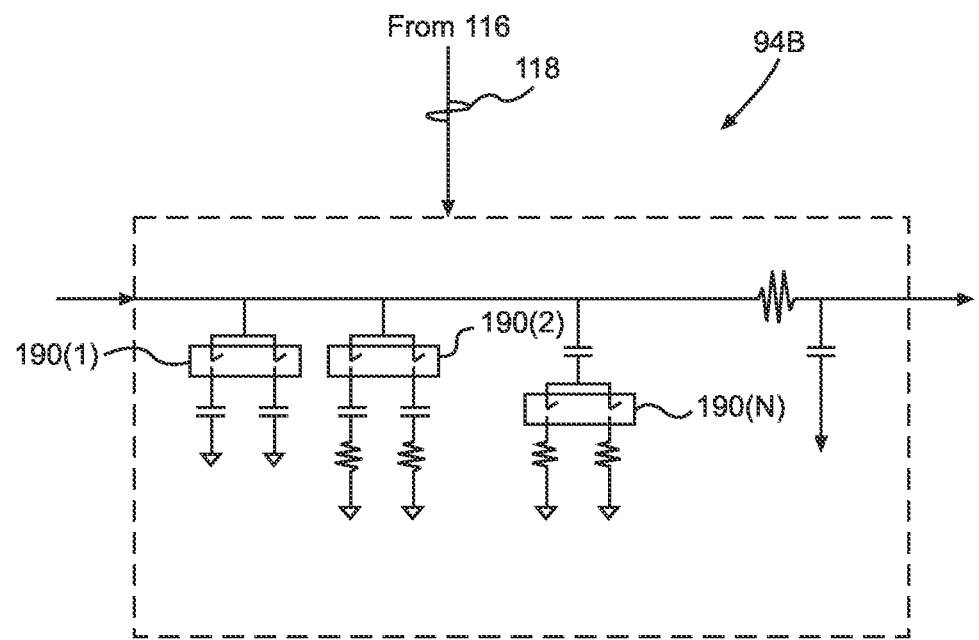
FIG. 7B is a circuit diagram of an exemplary loop filter with multiple resistors and capacitors with switches to select therebetween according to mode according to exemplary aspects of the present disclosure.

Likewise, FIG. 7B illustrates a loop filter 94B with switches 190(1)-190(N) that may be used to switch between different capacitances and resistances. Note that as illustrated, switches 190(N) allow for just the resistances to be switched, while leaving the capacitance associated therewith unchanged. Other switching arrangements are possible. As with the loop filter 94A, the mode signal 118 causes the switches 190(1)-190(N) to open and close so as to switch between the first mode and the second mode.

Those skilled in the art will recognize improvements and modifications to the embodiments of the present disclosure. All such improvements and modifications are considered within the scope of the concepts disclosed herein and the claims that follow.

What is claimed is:

1. An average power tracking (APT) circuit comprising:
   a digital-to-analog converter (DAC) comprising:
   a change signal output; and
   a target control voltage signal output;

a transition management circuit coupled to the change signal output and comprising a mode output configured to provide a mode signal;

a loop filter coupled to the target control voltage signal output and the mode output, wherein a change in the mode signal causes the loop filter to switch between a first mode and a second mode and wherein the loop filter is configured to provide a signal, wherein the first mode comprises a fast mode and the second mode comprises a slow mode, wherein the fast mode changes the signal faster than the slow mode; and output circuitry configured to provide a voltage control signal based on the signal from the loop filter.

2. The APT circuit of claim 1, wherein the output circuitry comprises:

a switch control circuit coupled to the loop filter and the transition management circuit, the switch control circuit configured to receive the signal from the loop filter; and a switch array circuit comprising a plurality of power switches coupled to the switch control circuit, wherein the switch control circuit is configured to control which of the plurality of power switches are open and which are closed based on the signal.

3. The APT circuit of claim 1, further comprising:
an adder circuit positioned between the DAC and the loop filter; and
a feedback circuit coupled to the adder circuit.

4. The APT circuit of claim 1, further comprising a pulse shaper circuit coupled to the transition management circuit and the target control voltage signal output.

5. The APT circuit of claim 4, further comprising a second adder circuit coupled to the loop filter and the pulse shaper circuit and wherein the pulse shaper circuit is configured to provide a pulse signal that is added to the signal from the loop filter by the second adder circuit.

6. An average power tracking (APT) circuit comprising:
a digital-to-analog converter (DAC) comprising:
a change signal output; and
a target control voltage signal output;
a transition management circuit coupled to the change signal output and comprising a mode output configured to provide a mode signal;
a loop filter coupled to the target control voltage signal output and the mode output, wherein a change in the mode signal causes the loop filter to switch between a first mode and a second mode and wherein the loop filter is configured to provide a signal;
a pulse shaper circuit coupled to the transition management circuit and the target control voltage signal output; and
output circuitry configured to provide a voltage control signal based on the signal from the loop filter.

7. The APT circuit of claim 1, wherein the loop filter is configured to operate with a first resistance in the first mode and a second resistance in the second mode, wherein the first resistance is not equal to the second resistance.

8. The APT circuit of claim 1, wherein the loop filter is configured to operate with a first capacitance in the first mode and a second capacitance in the second mode, wherein the first capacitance is not equal to the second capacitance.

9. The APT circuit of claim 1, wherein the loop filter comprises at least one variable resistor.

10. The APT circuit of claim 1, wherein the loop filter comprises at least one variable capacitor.

11. The APT circuit of claim 1, wherein the loop filter comprises at least two resistors and a switch configured to connect one or the other of the at least two resistors based on the signal.

12. The APT of claim 1, wherein the loop filter comprises at least two capacitors and a switch configured to connect one or the other of the at least two capacitors based on the signal.

13. The APT of claim 1, wherein the transition management circuit is configured to change modes with the mode signal from the first mode to the second mode after approximately one microsecond (1 μs) in the first mode.

14. The APT of claim 1, wherein the transition management circuit is configured to change modes with the mode signal from the first mode to the second mode before approximately four microseconds (4 μs) in the first mode.

15. The APT of claim 1, wherein the DAC further comprises an input configured to receive a digital target voltage signal and wherein the DAC is configured to provide a change signal at the change signal output when the digital target voltage signal changes.

16. The APT of claim 1, wherein the DAC further comprises an input configured to receive a digital target voltage signal and wherein the DAC is configured to provide a change signal at the change signal output when the digital target voltage signal changes more than a predefined threshold.

17. The APT circuit of claim 4, wherein the pulse shaper circuit is configured to have a programmable duration period.

18. The APT circuit of claim 17, wherein the programmable duration period is a function of a battery voltage.

19. The APT circuit of claim 17, wherein the programmable duration period is a function of a voltage step change.

20. An average power tracking (APT) circuit comprising:
a digital-to-analog converter (DAC) comprising:
a change signal output; and
a target control voltage signal output;
a transition management circuit coupled to the change signal output and comprising a mode output configured to provide a mode signal;
a loop filter coupled to the target control voltage signal output and the mode output, wherein a change in the mode signal causes the loop filter to switch between a first mode and a second mode and wherein the loop filter is configured to provide a signal; and
output circuitry configured to provide a voltage control signal based on the signal from the loop filter, wherein the output circuitry comprises:
a switch control circuit coupled to the loop filter and the transition management circuit, the switch control circuit configured to receive the signal from the loop filter; and
a switch array circuit comprising a plurality of power switches coupled to the switch control circuit, wherein the switch control circuit is configured to control which of the plurality of power switches are open and which are closed based on the signal.

* * * * *